United States Patent [19]
Ohtsuki et al.

[11] Patent Number: 5,574,679
[45] Date of Patent: Nov. 12, 1996

[54] MEMORY DATA PROTECTION FOR A FERROELECTRIC MEMORY

[75] Inventors: Tetsuya Ohtsuki; Hiroki Koike, both of Tokyo, Japan

[73] Assignee: NEC Corporation, Tokyo, Japan

[21] Appl. No.: 549,417

[22] Filed: Oct. 27, 1995

[30] Foreign Application Priority Data

Oct. 27, 1994 [JP] Japan .................. 6-263751

[51] Int. Cl.$^6$ .............................................. G11C 11/22
[52] U.S. Cl. ............................... 365/145; 326/105
[58] Field of Search ........................... 365/145, 149, 365/230.06; 326/105

[56] References Cited

U.S. PATENT DOCUMENTS

| | | | |
|---|---|---|---|
| 5,297,077 | 3/1994 | Imai et al. | 365/145 |
| 5,307,304 | 4/1994 | Saito et al. | 365/149 |
| 5,331,601 | 7/1994 | Parris | 365/230.06 |
| 5,365,482 | 11/1994 | Nakayama | 365/230.06 |

FOREIGN PATENT DOCUMENTS

| | | |
|---|---|---|
| 63-201998 | 8/1988 | Japan . |
| 1-158691 | 6/1989 | Japan . |

OTHER PUBLICATIONS

"A 256 kb Nonvolatile Ferroelectric Memory at 3V and 100 ns", ISSCC94, Session 16, Technology Directions; Memory, Packaging Paper FA 16.2, Feb. 1994 IEEE International Solid–State Circuits Conference, pp. 268–269, 350.

Primary Examiner—David C. Nelms
Assistant Examiner—Michael T. Tran
Attorney, Agent, or Firm—Foley & Lardner

[57] ABSTRACT

A nonvolatile ferroelectric memory device comprises a power supply and a memory cell array having a plurality of memory cells arranged in rows and columns and further comprises a plate-voltage level generator, a power supply voltage detector, and a protective control circuit. The plate-voltage level generator generates a plate voltage on a plate line connected to the one electrode of a ferroelectric capacitor of each memory cell. The power supply voltage detector detects a voltage of the power supply to generate a low-voltage detection signal when the power supply voltage is lower than a threshold voltage. The protective control circuit responsive to the low-voltage detection signal fixes the word lines at a grounding voltage level so as to protect the ferroelectric capacitor from a voltage change of the word line. The protective control circuit may fix the bit lines at the plate voltage level when the power supply voltage is lower than the threshold voltage.

20 Claims, 10 Drawing Sheets

C : FERROELECTRIC CAPACITOR
Tr : SWITCHING TRANSISTOR

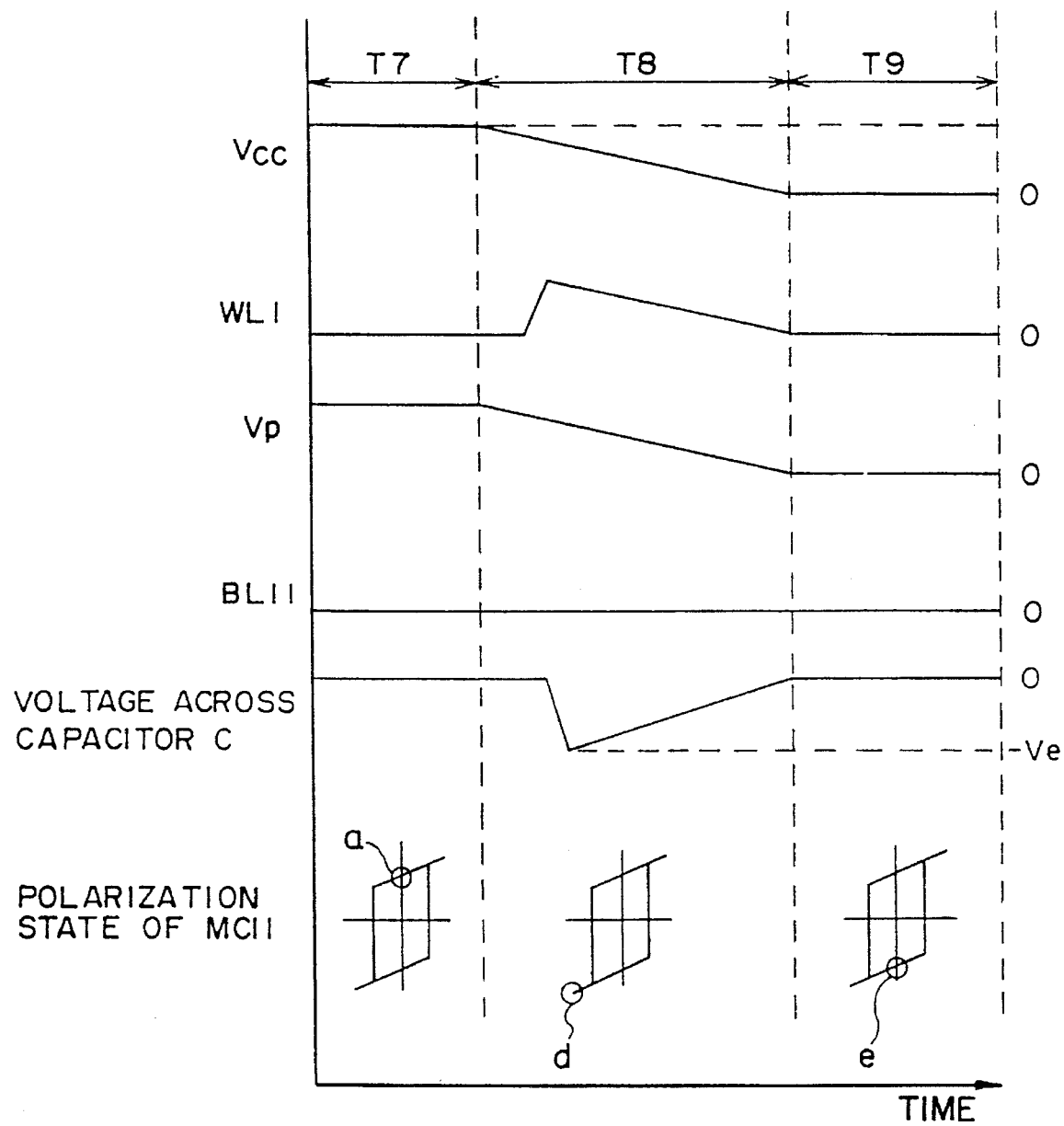

5,574,679

MEMORY DATA PROTECTION FOR A FERROELECTRIC MEMORY

BACKGROUND OF THE INVENTION

1. Field of the Invention

The present invention relates to a nonvolatile memory device, and in particular to data protection of a nonvolatile ferroelectric memory device.

2. Description of the Related Art

Recently, a nonvolatile memory, which has a function of retaining data even when powered off, has been realized through the use of a ferroelectric material such as lead zirconate titanate (PZT) exhibiting hysteresis characteristics. Employing such a ferroelectric material in a memory cell, the nonvolatile memory can be achieved with a simple structure. Several examples of the application are disclosed in Japanese Patent Unexamined Publications Nos. 63-201998 and 1-158691 and the paper "A 256 Kb Nonvolatile Ferroelectric Memory at 3 V and 100 ns" (International Solid-State Circuits Conference, ISSCC, Digest of Technical Papers, pp. 268–269, February, 1994).

A ferroelectric memory cell will be described hereinafter based on the above-mentioned publications. FIG. 1A shows the circuit of a ferroelectric memory cell. A memory cell MC consists of a switching transistor Tr and a ferroelectric capacitor C (1-Transistor and 1-capacitor per bit: 1T/1C). The switching transistor Tr has two major electrodes (drain and source) connected to one electrode of the capacitor C and a bit line BL, respectively, and has the gate electrode connected to a word line WL. The other electrode of the capacitor C is connected to a plate line PL.

A read and write operation of the memory cell MC is described referring to FIGS. 1B and 1C. First of all, as shown in FIGS. 1B and 1C, the ferroelectric capacitor C exhibits hysteresis characteristics with respect to a voltage V across the capacitor C. Therefore, 1-bit data is stored in the ferroelectric capacitor C as the difference in polarization P between the point a and the point e for V=0. More specifically, the values 1 and 0 of the 1-bit data may be in correspondence with the state points a and e of polarization P, respectively. This relationship will be employed in the following examples.

As illustrated in FIG. 1B, assuming that the data value 1 is stored in the ferroelectric capacitor C whose polarization state is at the point a. When the switching transistor Tr is forced into conduction (or ON) by applying a high-voltage level (here, the power supply voltage Vcc) to the word line WL and a negative voltage −Ve is applied to the ferroelectric capacitor C through the bit line BL and the plate line PL, the polarization P is changed from the state point a to the state point d via state points b and c. Charge Q1 corresponding to this state transition is transferred between the bit line BL and the ferroelectric capacitor C through the switching transistor Tr. The charge transfer can be detected by a sense amplifier connected with the bit line BL, which means that the data value 1 is read from the memory cell MC. After reading the data from the memory cell MC, the same data "1" on the bit line BL is written back onto the memory cell MC by lowering the voltage of the plate line PL. This write sequence follows the reverse state transition from the state point e to the state point h via state points f and g.

On the other hand, as illustrated in FIG. 1C, in the case that the data value 0 has been stored in the ferroelectric capacitor C whose polarization state is at the point e, the polarization P is changed from the state point e to the state point d via the state point c. Charge Q0 corresponding to this state transition is transferred between the bit line BL and the ferroelectric capacitor C through the switching transistor Tr. The charge transfer can be detected by the sense amplifier connected with the bit line BL, which means that the data value 0 is read from the memory cell MC.

By arranging a lot of ferroelectric memory cells MCs in rows and columns which are connected with sense amplifiers, address decoders and other necessary circuits, a conventional ferroelectric memory device can be realized as described in the above-mentioned publications.

However, if an abrupt voltage is applied to the ferroelectric capacitor C during power-down or power-up, there is the possibility that the data stored in the memory cell MC is damaged. More specifically, assuming that the data value 1 is stored in the ferroelectric capacitor C whose polarization state is at the point a as illustrated in FIG. 1B and then the memory device is powered down. During power-down, if a word line WL abruptly increases in voltage due to a malfunction of the X-decoder, causing the switching transistor Tr to be forced into conduction, then the negative voltage −Ve is applied to the ferroelectric capacitor C on condition that a voltage of the plate line PL is higher than that of the bit line B1 by the voltage Ve. As a result, the polarization P of the ferroelectric capacitor C is shifted from the state point a to the state point d via state points b and c. Therefore, after power-down, the polarization P settles at the state point e corresponding to the data value 0, which means that the contents of the memory cell MC is damaged.

SUMMARY OF THE INVENTION

An object of the present invention is to provide a nonvolatile memory device which stably maintains the contents of the memory cells.

Another object of the present invention is to provide a nonvolatile memory device and a data protection method which are capable of protecting ferroelectric memory cells from data damage when a power supply voltage is at a lower voltage level, for example, during power-up or power-down.

In accordance with an aspect of the present invention, a memory device comprises a power supply and a memory cell array having a plurality of memory cells arranged in rows and columns and further comprises a plate-voltage level generator, a power supply voltage detector, and a protective control circuit. The plate-voltage level generator generates a first predetermined voltage Vp on a plate line connected to the one electrode of a ferroelectric capacitor of each memory cell. The power supply voltage detector detects an voltage Vcc of the power supply to generate a low-voltage detection signal Vcd when the power supply voltage Vcc is lower than a predetermined threshold voltage Vj. The protective control circuit responsive to the low-voltage detection signal Vcd fixes word lines at a second predetermined voltage, preferably a grounding voltage level, so as to protect the ferroelectric capacitor from a voltage change of the word line.

The protective control circuit preferably comprises a word line controller and a protective circuit. The word line controller outputs one of a selection signal and a non-selection signal to the word line according to an address signal received from outside. The protective circuit responsive to the low-voltage detection signal outputs the non-selection signal to the word lines regardless of the address signal.

In accordance with another aspect of the present invention, a memory device comprises a power supply and a memory cell array having a plurality of memory cells arranged in rows and columns and further comprises a plate-voltage level generator, a power supply voltage detector, and a bitline-plateline voltage equalizer. The plate-voltage level generator generates a first predetermined voltage Vp on a plate line connected to the one electrode of a ferroelectric capacitor of each memory cell. The power supply voltage detector detects an voltage Vcc of the power supply to generate a low-voltage detection signal Vcd when the power supply voltage Vcc is lower than a predetermined threshold voltage Vj. The bitline-plateline voltage equalizer responsive to the low-voltage detection signal fixes bit lines at the first predetermined voltage so as to protect the ferroelectric capacitor from a voltage change of the word line.

According to the present invention, during power-down and power-up where the word lines is subject to influences of malfunctions or noises, the protective control circuit protects the ferroelectric capacitors from data damage by applying no voltage to the ferroelectric capacitors.

BRIEF DESCRIPTION OF THE DRAWINGS

FIG. 11 is a waveform chart showing the transition during power-down in a conventional memory device.

DETAILED DESCRIPTION OF THE PREFERRED EMBODIMENTS

FIRST EMBODIMENT

Figure 2:
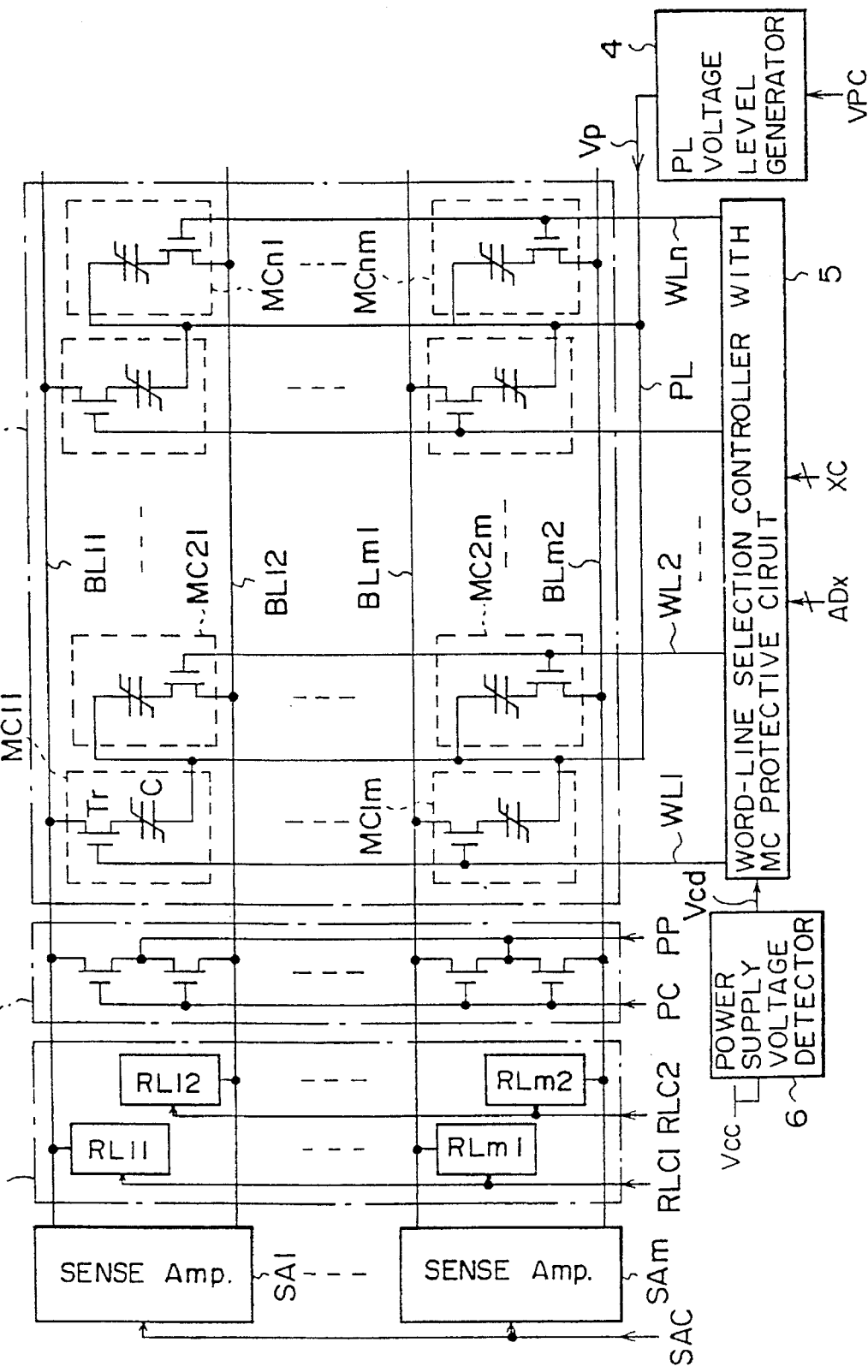
FIG. 2 is a block diagram showing a circuit configuration of a nonvolatile memory device of a first embodiment according to the present invention.

Referring to FIG. 2, a memory device according to the present invention is comprised of a memory cell array 1, bit-line precharger 2, a reference voltage level generator 3, a plate-line voltage level generator 4, a word-line selection controller 5, a power supply voltage detector 6, sense amplifiers SA1–SAm, and other necessary circuits such as a power supply circuit and a memory controller (not shown).

The memory cell array 1 is comprised of a plurality of memory cells MC11–MCnm arranged in m rows and n columns. Each of the memory cells consists of a switching transistor Tr and a ferroelectric capacitor C (1-Transistor and 1-capacitor per bit: 1T/1C). The switching transistor Tr has two major electrodes (drain and source) connected to one electrode of the capacitor C and a bit line BL, respectively, and has the gate electrode connected to a word line WL. The other electrode of the capacitor C is connected to a plate line PL.

In the memory cell array 1, the respective gates of the switching transistors Trs of the m memory cells in each column are connected in common to the word line. More specifically, the memory cells MC11–MC1m in the first column are connected to the word line WL1, and the memory cells MC21–MC2m in the second column are connected to the word line WL2. It is the same with other columns. A pair of bit lines BLi1 and BLi2 (i=1,2, . . . ,m) are provided in each row for reading/writing data from/onto a memory cell, and the switching transistors of the memory cells MC1i–MCni of each row are connected alternately to one of the bit lines BLi1 and BLi2. For example, in the first row, the memory cell MC11 is connected to the bit line BL11, the memory cell MC21 to the bit line BL12, the memory cell MC31 to the bit line BL11, and so on. It is the same with other rows.

The bit-line precharger 2 is comprised of m pairs of transistors each pair corresponding to the pair of bit lines. A precharge control signal is applied to the respective gate electrodes of each pair of the transistors in predetermined timing, causing all the bit lines to be set at a precharge potential PP. In this case, the precharge potential is set at the grounding potential.

The reference voltage level generator 3 is comprised of m pairs of circuits RLi1 and RLi2 corresponding to the pairs of the bit lines BLi1 and BLi2, respectively. A first control signal RLC1 is supplied to the first circuits RL11–RLm1 and a second control signal RLC2 is supplied to the second circuits RL12–RLm2. According to the first control signal RLC1, a reference voltage is applied to the bit lines BL11–BLm1, and according to the second control signal RLC2, the reference voltage is applied to the bit lines BL12–BLm2. The reference voltage is determined to be at the center between bit line voltages of the data value 1 and the data value 0 (see ISSCC, Digest of Technical Papers, pp. 268, February, 1994).

A pair of bit lines BLi1 and BLi2 are connected to a sense amplifier SAi which detects a data signal read from a memory cell MC selected by the word-line selection controller 5. The sense amplifier SAi is typically comprised of a differential amplifier which is activated by a sense amplification control signal SAC.

The plate-line voltage level generator 4 supplies a plate-line voltage Vp to each memory cell MC through the plate line PL in accordance with a control signal VPC.

The work-line selection controller 5 outputs a selection signal (power supply voltage level: Vcc) to one word line selected from n word lines WL1–WLn and a non-selection signal (grounding level) to the other word lines according to row address data ADx and a row control signal XC received from outside. As described later, the word-line selection controller 5 has a memory cell protective circuit which outputs the non-selection signal to all the word lines WL1–WLn in response to a low-voltage detection signal Vcd which is low received from the power supply voltage detector 6.

The power supply voltage detector 6 checks whether an output voltage of the power supply circuit is lower than a threshold voltage level. If the power supply voltage is lower than the threshold level, the power supply voltage detector 6 outputs the low-voltage detection signal Vcd to the word-line selection controller 5.

Figure 3:
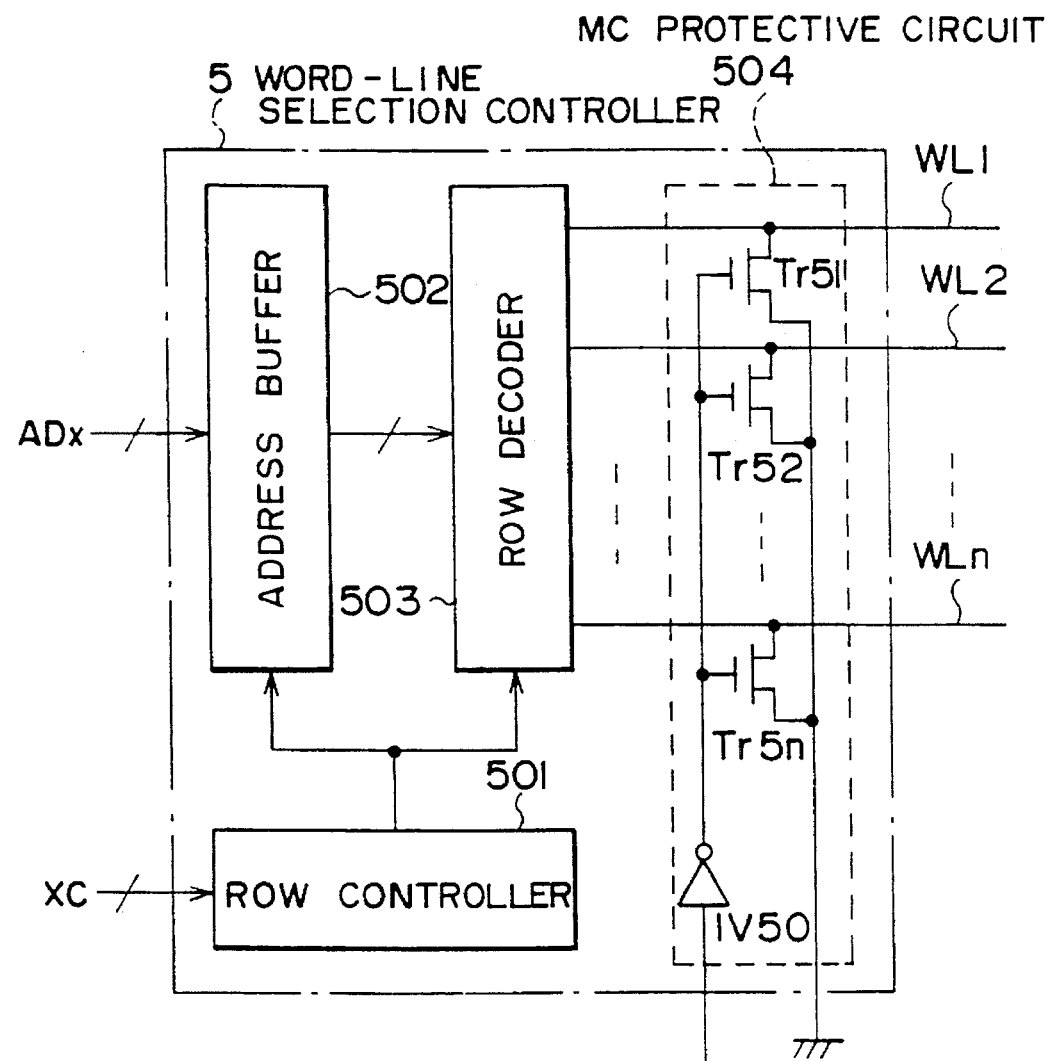
FIG. 3 is a block diagram showing a detailed circuit of a WL selection controller and a power supply voltage detector in the first embodiment.
Figure 3:
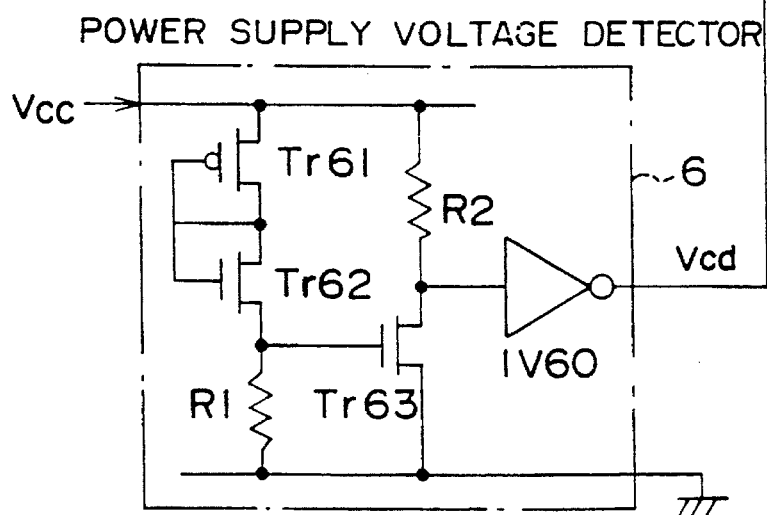

As illustrated in FIG. 3, the word-line selection controller 5, as a first example, is comprised of a row controller 501, an address buffer 502, a row decoder 503, and a memory-cell (MC) protective circuit 504. The row controller 501 controls the input/output operation of the address buffer 502 and the decoding operation of the row decoder 503 based on the row control signal XC. The row address data ADx is retained in the address buffer 502 and then is decoded into a selection signal and non-selection signals by the row decoder 503. In other words, the row decoder 503 selects one of the word line WL1–WLn and outputs the selection signal to the selected word line by decoding the row address data ADx stored in the address buffer 502.

The MC protective circuit 504 is comprised of n switching transistors Tr51–Tr5n and an inverter circuit IV50. The respective word lines WL1–WLn are connected to the grounding level through the switching transistors Tr51–Tr5n. The gate electrodes of the switching transistors Tr51–Tr5n are connected in common to the power supply voltage detector 6 through the inverter circuit IV50. In this case, the switching transistors Tr51–Tr5n become in ON state when a high voltage is applied to the gate electrodes thereof. Therefore, when receiving the low-voltage detection signal Vcd from the power supply voltage detector 6, the switching transistors Tr51–Tr5n are simultaneously forced into conduction to set the word lines WL1–WLn at the grounding level. In other words, the non-selection signal is output to all the word lines WL1–WLn.

The power supply voltage detector 6 is comprised of a p-channel transistor Tr61 of a threshold voltage Vt1, a n-channel transistor Tr62 of a threshold voltage Vt2, a n-channel transistor Tr63 of a threshold voltage Vt3, an inverter circuit IV60, and resistors R1 and R2. The transistor Tr61 has a source electrode receiving the power supply voltage Vcc and a drain and gate electrodes connected to each other. The transistor Tr62 has a gate and drain electrodes connected to each other and further connected to the gate and drain electrodes of the transistor Tr61. The source electrode of the transistor Tr62 is connected to a ground through the resistor R1 whose resistance is sufficiently larger than a resistance in conduction of the transistors Tr61–Tr63. The transistor Tr63 has a drain electrode connected to the input of the inverter IV60 and further connected to the power supply voltage Vcc through the resistor R2 whose resistance is sufficiently larger than a resistance in conduction of the transistors Tr61–Tr63. The gate electrode of the transistor Tr63 is connected to the source electrode of the transistor Tr62 and the source electrode of the transistor Tr63 is grounded.

In the power supply voltage detector 6 having such a circuit configuration, a necessary condition for bringing the transistor Tr63 into conduction is represented by the following: $Vt3 \leq Vcc - Vt1 - Vt2$, or $Vcc \geq Vt1 + Vt2 + Vt3$.

Therefore, if a threshold level Vj of the power supply voltage detector 6 is previously set at the voltage level (Vt1 + Vt2 + Vt3), when the power supply voltage Vcc is lower than the threshold level Vj, the transistor Tr63 is in a non-conduction (OFF) state with its drain voltage kept at the high level of Vcc, causing the output voltage Vcd of the inverter circuit IV60 to be set low, that is, the grounding level. Therefore, all the transistors Tr51–Tr5n of the MC protective circuit 504 are forced into conduction, causing the word-line selection controller 5 to output the non-selection signal to all the memory cells MC11–MCnm through the word lines WL1–WLn independently of the output signals of the row decoder 503.

On the other hand, when the power supply voltage Vcc is equal to or larger than the threshold level Vj, the transistor Tr63 is in a conduction (ON) state with its drain voltage kept at the grounding level, causing the output voltage Vcd of the inverter circuit IV60 to be the high level of about Vcc. Therefore, all the transistors Tr51–Tr5n of the MC protective circuit 504 are forced out of conduction, causing the word-line selection controller 5 to output the decoded signals of the row decoder 503 to the memory cells MC11–MCnm through the word lines WL1–WLn.

Read Operation

Figure 1A:
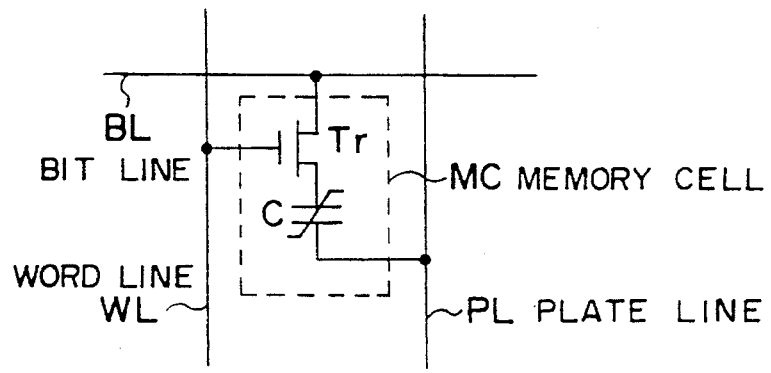
FIG. 1A is a circuit diagram showing a 1T/1C ferroelectric memory cell.
Figure 4:
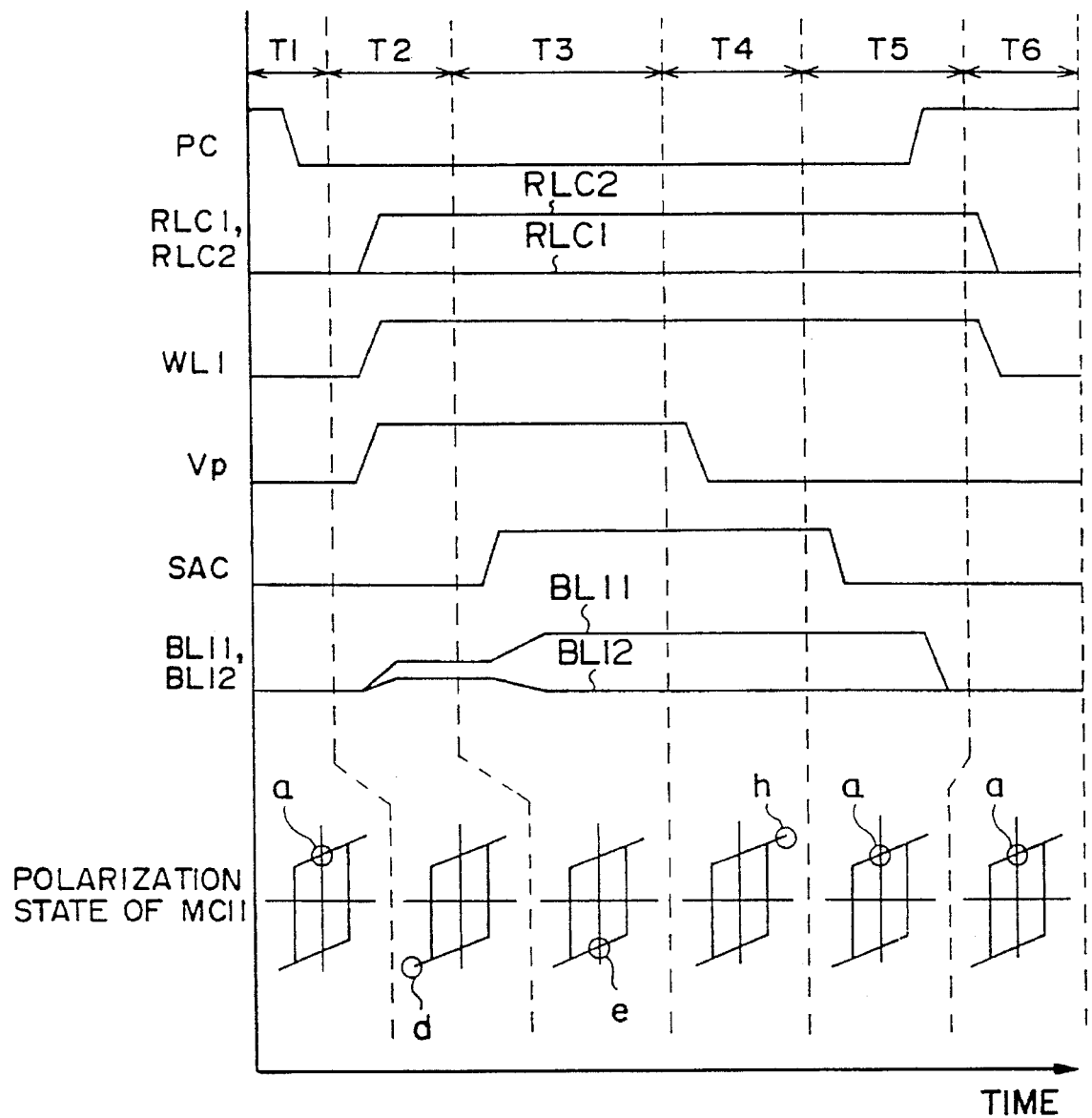
FIG. 4 is a waveform chart showing the read and write operation of a memory cell in the first embodiment.

Referring to FIG. 4, the read and write operations of the memory device as shown in FIG. 1 will be described hereinafter. For simplicity, the memory cell MC11 connected to the bit lines BL11 is taken as an example.

In the period T1, when changing the precharge control signal PC from high to low, the bit-line precharger 2 sets the bit lines BL11–BLm1 and BL12–BLm2 floating.

In the subsequent period T2, the word-line selection controller 5 outputs the selection signal to the word line WL1, which causes the switching transistors Trs of the first column to be forced into conduction. At the same time, the PL voltage level generator 4 sets the PL voltage Vp of the plate line PL high. Therefore, charges corresponding to the data values stored in the ferroelectric capacitors of the memory cells in the first column are transferred to the floating bit lines BL11–BLm1, respectively. In addition, when the second control signal RLC2 goes high, the second circuits RL12–RLm2 set the bit lines BL12–BLm2 at the reference voltage, respectively. As mentioned above, the reference voltage is set at the center between bit line voltages of the data value 1 and the data value 0.

After that, in the period T3, the sense amplification control signal SAC goes high and thereby the sense amplifiers SA1–SAm are activated to amplify respective differential voltages between the bit lines BLi1 and BLi2. In this manner, the one word data is read out from the memory cells MC11–MClm of the first column.

Figure 1B:
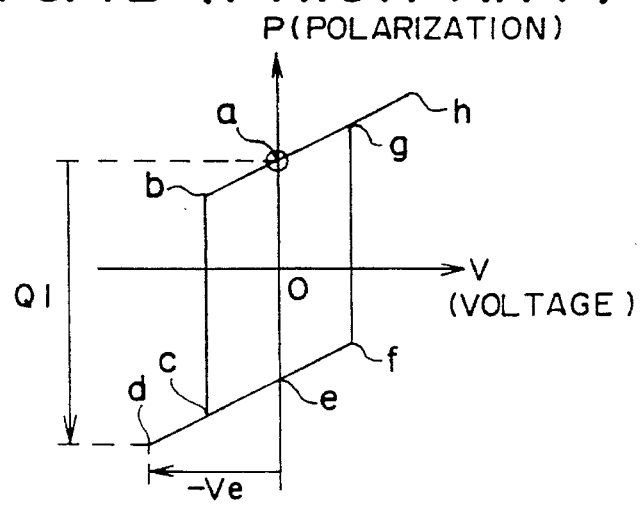
FIG. 1B is a graph showing the hysteresis characteristics of a ferroelectric capacity for explaining the read operation of data "1"
Figure 1C:
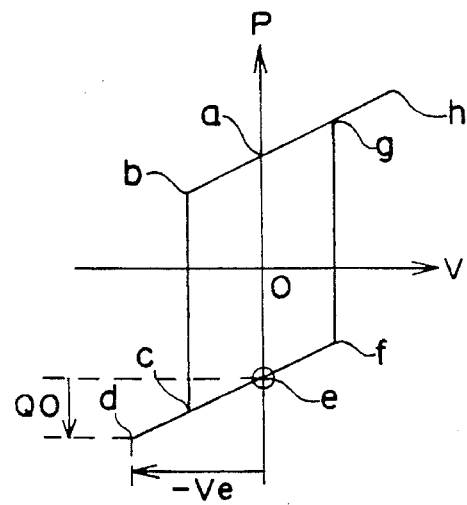
FIG. 1C is a graph showing the hysteresis characteristics of a ferroelectric capacity for explaining the read operation of data "0"

However, as have shown in FIGS. 1B and 1C, when the switching transistor Tr is forced into conduction with the plate voltage Vp high, the negative voltage –Ve is applied to the ferroelectric capacitor C through the bit line BL11 and the plate line PL. Therefore, the polarization P is changed from the state point a or e to the state point d as shown in FIGS. 1B and 1C. Since the resultant state points are identical, it is impossible to decide which data had been stored in the ferroelectric capacitor C, "1" or "0". Therefore, it is necessary to write the read data existing on the bit line BL back to the ferroelectric capacitor C by applying a voltage corresponding to the read data value to the ferroelectric capacitor C. Such a data write-back operation is performed during the periods T4–T6 following the periods T1–T3.

In the period T4, on condition that the word line WL1 is selected and the switching transistor Tr of the memory cell MC11 is in ON state, the PL voltage level generator 4 makes the plate voltage Vp low according to the control signal VPC. Since the potential of the bit line BL11 is high when the data value "1" has been read, a positive voltage +Ve is applied to the ferroelectric capacitor C of the memory cell MC11. Therefore, the polarization P is set at the state point h as shown in FIG. 1C. On the other hand, since the potential of the bit line BL11 is low when the data value "0" has been read, no voltage is applied to the ferroelectric capacitor C of the memory cell MC11. Therefore, the polarization P remains at the state point e.

In the period T5, the sense amplification control signal SAC goes low, causing the sense amplifiers SA1–SAm to be deactivated. In addition, the precharge control signal PC goes high, causing the bit lines to be set at the precharge potential PP, that is, the grounding level. Therefore, the polarization P goes back to the previous state as in the period T1.

Finally, in the period T6, the reference level control signal RLC2 goes low and the word-line selection controller 5 outputs the non-selection signal to the word line WL1. Since the voltage of the word line WL1 goes low, the switching transistors Trs of the memory cells MC11–MC1m are forced out of conduction. In this way, the read operation of the memory cell MC11 is completed.

Write Operation

The data write operation such that a data bit received from outside is written onto, for example, the memory cell MC11, is performed by the above-mentioned operations of the periods T3–T6. First, in the operation state of the period T3, a differential voltage corresponding to the data bit to be written is applied to the bit lines BL11 and BL12.

Subsequently, as in the case of the period T4, on condition that the word line WL1 is selected and the switching transistor Tr of the memory cell MC11 is in ON state, the PL voltage level generator 4 makes the plate voltage Vp low according to the control signal VPC. Since the potential of the bit line BL11 is high when the data value "1" has been input, a positive voltage +Ve is applied to the ferroelectric capacitor C of the memory cell MC11. Therefore, the polarization P is set at the state point h as shown in FIG. 1C. On the other hand, since the potential of the bit line BL11 is low when the data value "0" has been input, no voltage is applied to the ferroelectric capacitor C of the memory cell MC11. Therefore, the polarization P remains at the state point e.

In this way, the data bit "1" or "0" is stored as a different polarization state a or e in the ferroelectric capacitor C of the memory cell MC11. Therefore, the data is retained even when no voltage across the ferroelectric capacitor is applied after powering off.

Data Protective Operation

A data protective operation will be described in detail hereinafter. According to the embodiment, the data protection is performed by the word-line selection controller 5 and the power supply voltage detection 6 as shown in FIG. 3.

Figure 5:
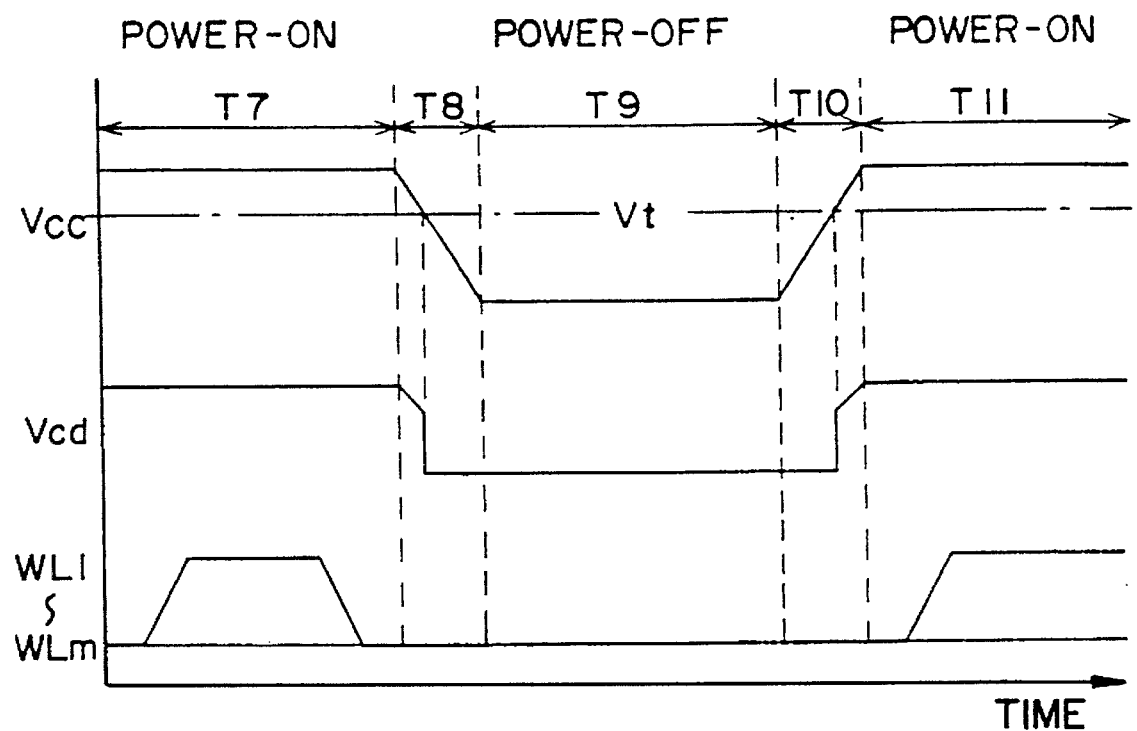
FIG. 5 is a waveform chart showing the protective operation during power-up and power-down in the first embodiment.

Referring to FIG. 5, the periods T8 and T10 indicate transitions during power-down and power-up, respectively. The threshold level Vj is preset in the power supply voltage detector 6 as mentioned above.

Assume that power is normally supplied to the memory device and the power supply voltage Vcc falls within the prescribed range for the periods T7 and T11. Since the voltage detection signal Vcd is high in these periods T7 and T11, the usual memory access operation as mentioned above is performed by the word-line selection controller 5.

For the period T8 of power-down, the power supply voltage Vcc is being reduced from the prescibed voltage. When the voltage Vcc reduces below the threshold level Vj, the detection signal Vcd goes low. Therefore, the switching transistors Tr51–Tr5n of the protective circuit 504 are forced into conduction, causing the non-selection signal to be output to the word lines WL1–WLn. In other words, the word lines WL1–WLn are set at the grounding level. Since all the switching transistors of the memory cells receive the non-selection signal through the word lines WL1–WLn, the switching transistors are forced out of conduction, achieving data protection of the ferroelectric capacitors from abrupt voltage changes on the word line due to some malfunction of the word-line selection controller 5. Therefore, the data stored in each capacitor is retained during power-down and power-off.

It is the same with the case during power-up. Since the switching transistor of each memory cell is in OFF state until the power supply voltage Vcc exceeds the threshold level Vj, data protection of the capacitor from abrupt voltage changes on the word line WL is achieved during power-up and power-on.

Figure 6:
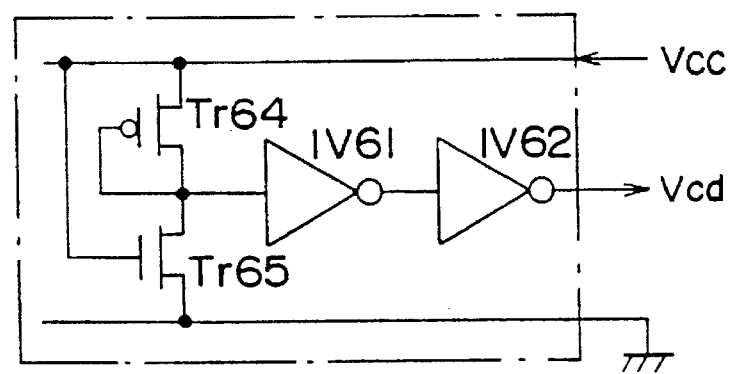
FIG. 6 is a circuit diagram of another example of the power supply voltage detector.

FIG. 6 shows another example of the power supply voltage detector 6, which is comprised of a p-channel transistor Tr64 of a threshold voltage Vt4, a n-channel transistor Tr65 of an ON resistance sufficiently larger than that of the p-channel transistor Tr65, and inverters IV 61 and IV62. The p-channel transistor Tr64 has a source electrode connected to the power supply voltage Vcc and gate and drain electrodes connected to each other and further connected to the drain electrode of the n-channel transistor Tr65. The n-channel transistor Tr65 has a gate electrode connected to the power supply voltage Vcc and a source electrode connected to the ground. The inverter IV61 inverts the drain voltage level of the transistor Tr65 when it passes a threshold level Vti preset in the inverter IV61. Similarly, the inverter IV62 inverts the output of the inverter IV61 to supply the detection signal Vcd to the word-line selection controller 5.

In such a circuit, the detection signal Vcd is low when the power supply voltage Vcc is lower than a voltage level Vt4+Vti, and the detection signal Vcd is high when Vcc is not lower than Vt4+Vti. Therefore, the threshold level Vj is preset at the level Vt4+Vti in the power supply voltage detector 6 as shown in FIG. 6.

SECOND EMBODIMENT

Figure 7:
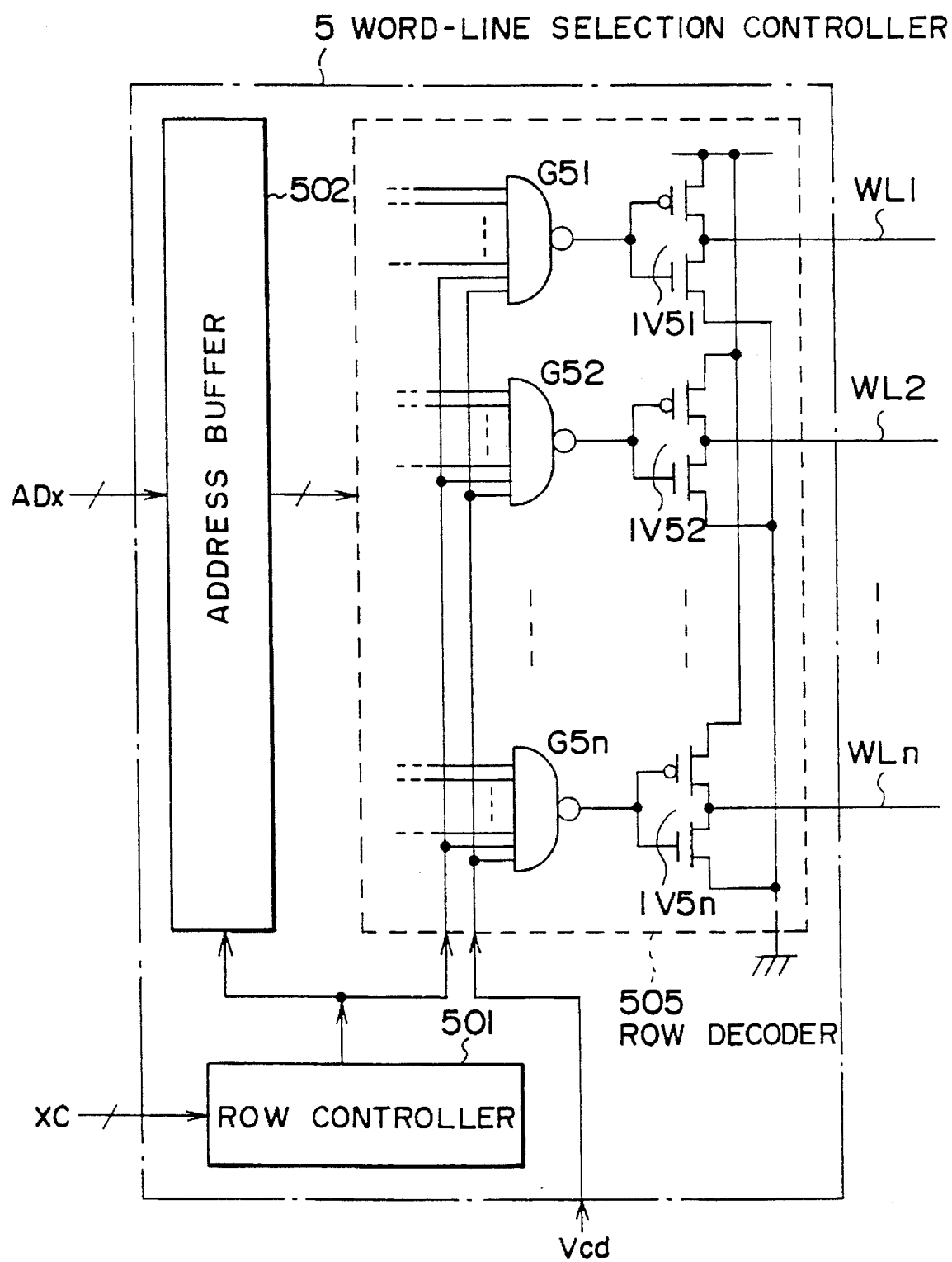
FIG. 7 is a block diagram showing a detailed circuit of a WL selection controller in a second embodiment according to the present invention.

As illustrated in FIG. 7, a protective circuit may be incorporated in a row decoder 505 of the word-line selection controller 5. In this figure, a decoding circuit for decoding the address data ADx is incorporated in the row decoder 505 but not shown. The protective circuit is comprised of logical NAND gates G51–G5n and CMOS type of inverters IV51–IV5n which are connected to the word lines WL1–WLn, respectively. The output of each NAND gate G5k (k=1,2,3, . . . ,n) is given to the CMOS inverter IV5k which, as well known, consists of a p-channel transistor and a n-channel transistor. The source electrode of the p-channel transistor of each CMOS inverter IV5i is connected to the power supply voltage Vcc. The source electrode of the n-channel transistor of each CMOS inverter IV5k is connected to the ground. The drain electrodes of the p-channel and the n-channel transistors are connected to each other and further connected to the corresponding word line WLk.

The NAND gates G51–G5n receive a decoded signal obtained by the decoding circuit, and further receive a control signal from the row controller 501 and the voltage detection signal Vcd from the power supply voltage detector 6. The power supply voltage detector 6 is as shown in FIG. 3 or FIG. 6.

According to this embodiment, when the voltage detection signal Vcd is high, the outputs of the NAND gates G51–G5n vary in accordance with the decoded signal of the address data ADx and the control signal received from the row controller 501. On the other hand, when the voltage detection signal Vcd is low, since all the outputs of the NAND gates G51–G5n are high, the word lines WL1–WLn are fixed at the grounding voltage level. In other words, the word-line selection controller 5 outputs non-selection signals to all the word lines WL1–WLn regardless of the address data ADx.

THIRD EMBODIMENT

Figure 8:
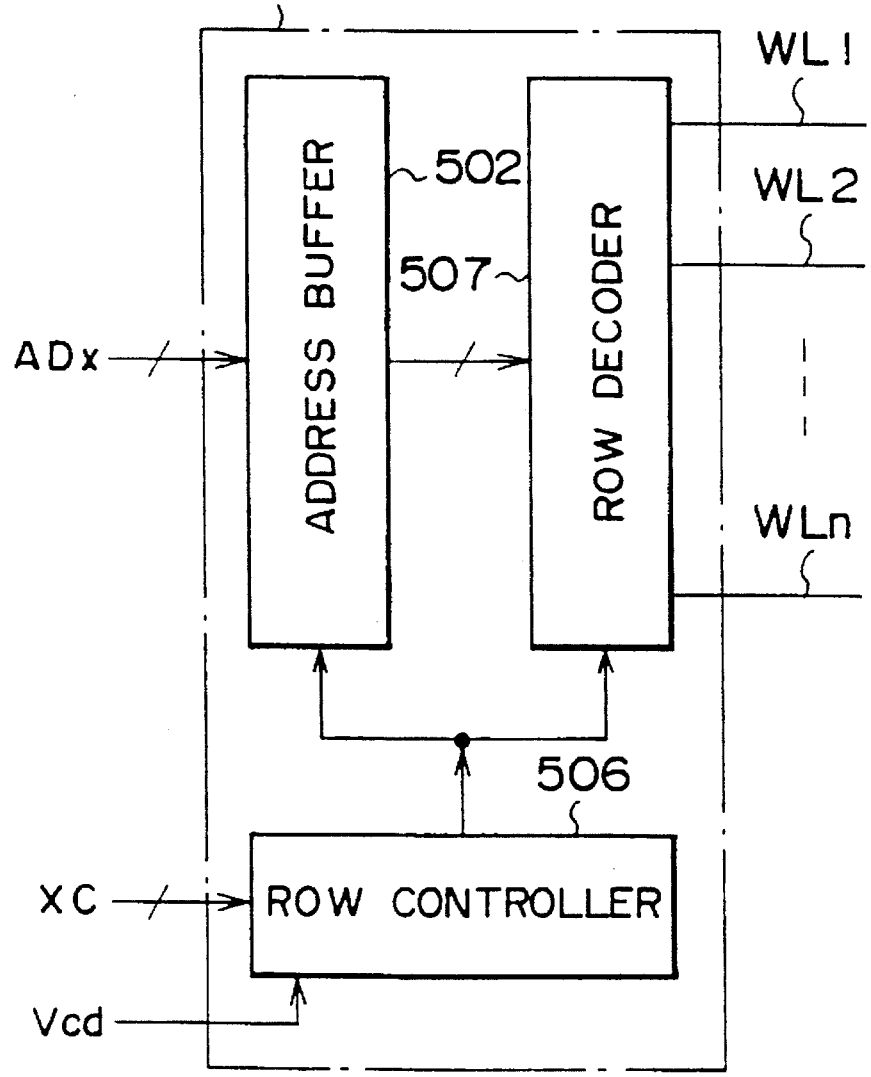
FIG. 8 is a block diagram showing a detailed circuit of a WL selection controller in a third embodiment according to the present invention.

Referring to FIG. 8, the word-line selection controller 5 may be comprised of the address buffer 502, a row controller 506, and a row decoder 507. The row controller 506 receives the detection signal Vcd from the power supply voltage detector 6 and outputs the control signal having the value 1 or 0 to the row decoder 507 according to the detection signal Vcd. The row decoder 507 has a circuit similar to the row decoder 507 as shown in FIG. 7. More specifically, the row decoder 507 is comprised of the decoding circuit, the NAND gates G51–G5n and the CMOS inverters IV51–IV5n except that the NAND gates G51–G5n do not receive the voltage detection signal Vcd. Since the row controller 501 outputs the control signal to the NAND gates G51–G5n according to the detection signal Vcd, the word lines WL1–WLn may be fixed at the grounding voltage level at the time when the voltage detection signal Vcd is low, as mentioned in the second embodiment.

In the above-mentioned embodiments, the non-selection signal applied to the word line WL1–WLn is set at the grounding voltage level. Since the grounding voltage level is not varied even when the power supply voltage Vcc is changed during power-down or power-up, all the switching transistors of the memory cells MC11–MCnm are securely forced to be nonconducting.

FOURTH EMBODIMENT

Figure 9:
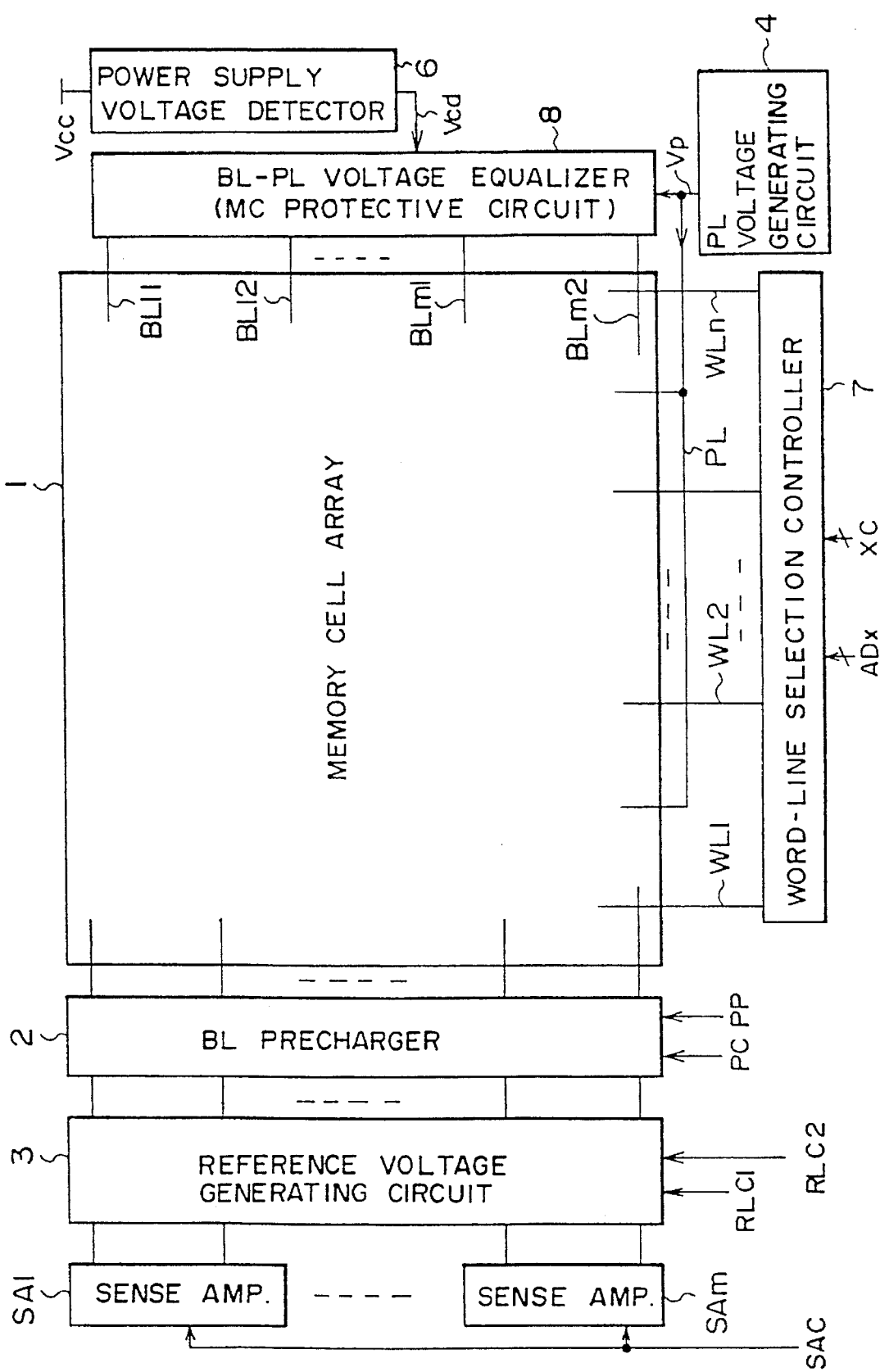
FIG. 9 is a block diagram showing a circuit configuration of a nonvolatile memory device of a fourth embodiment according to the present invention.

Referring to FIG. 9, a fourth embodiment of the present invention is provided with a BL-PL voltage equalizer 8 which is connected to the bit lines BL11–BLm2 as well as the plate line PL. The BL-PL voltage equalizer 8 equalizes the voltage of the bit lines BL11–BLm2 with that of the plate line PL according to the voltage detection signal Vcd received from the power supply voltage detector 6. The word lines WL1–WLn are connected to a word-line selection controller 7 which has no protective circuit for protecting the ferroelectric capacitors as mentioned above. Since other circuits are the same configuration as the case of FIG. 2, the descriptions about them are omitted.

Figure 10:
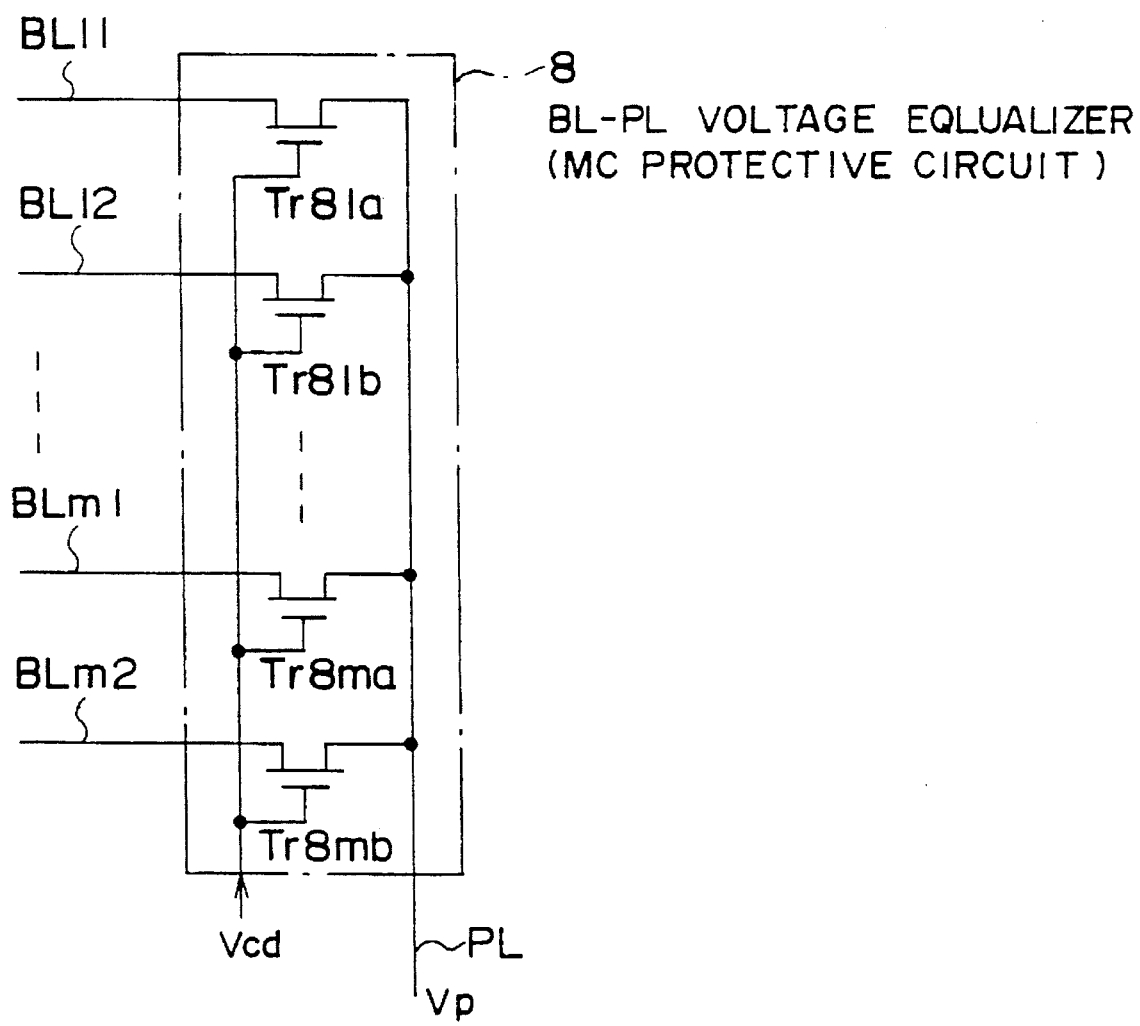
FIG. 10 is a circuit diagram showing a protective circuit of the fourth embodiment.

FIG. 10 shows a detailed circuit of the BL-PL voltage equalizer 8. The BL-PL voltage equalizer 8 is comprised of m pairs of switching transistors Tr8ia and Tr8ib (i=1,2,3,. . . ,m) which connect the pairs of the bit lines BLi1 and BLi2 with the plate line PL, respectively. The switching transistors Tr8ia and Tr8ib receive the voltage detection signal Vcd from the power supply voltage detector 6 and turns on when the voltage detection signal Vcd is low. Therefore, when the power supply voltage Vcc is reduced below the threshold level Vj, all the switching transistors Tr8ia and Tr8ib are forced into conduction to equalize the voltage of the bit lines with that of the plate line PL.

Employing such a circuit configuration as shown in FIGS. 9 and 10, the bit lines BL11–BLm2 and the plate line PL are equal in voltage when the voltage detection signal Vcd is low. Therefore, no voltage is applied across the ferroelectric capacitor of each memory cell MC even when the switching transistors of the m memory cells in a column are turned on by some malfunction of the word-line selection controller 7 during power-down and power-up.

Comparison

Referring to FIG. 11 and FIG. 5, a comparison is made between the conventional memory device and the first embodiment of the present invention.

FIG. 11 shows a waveform chart according to the conventional memory device. As mentioned above, during the period T8 of power-down, if the word line WL1 abruptly increases in voltage due to some malfunction of the row selection controller, causing the switching transistors of the first column to be forced into conduction, then the negative voltage −Ve is applied to the ferroelectric capacitor C on condition that a voltage Vp of the plate line PL is higher than that of the bit line B11 by the voltage Ve. As a result, the polarization P of the ferroelectric capacity C is shifted from the state point a to the state point d via state points b and c. Therefore, in the period T9 of power-off, the polarization P settles at the state point e corresponding to the data value 0, which means that the contents of the memory cell MC is damaged.

To the contrary, according to the present invention, as shown in FIG. 5, when the power supply voltage Vcc reduces below the threshold level Vj in the period T8 of power-down, the detection signal Vcd goes low. Therefore, the switching transistors Tr51–Tr5n of the protective circuit 504 are forced into conduction, causing the non-selection signal to be output to the word lines WL1–WLn. In other words, the word lines WL1–WLn are set at the grounding level. Since all the switching transistors of the memory cells receive the non-selection signal through the word lines WL1–WLn, the switching transistors are forced out of conduction, achieving data protection of the ferroelectric capacitors from abrupt voltage changes on the word line due to some malfunction of the word-line selection controller 5. It is the same with the circuit configuration as shown in FIGS. 9 and 10.

What is claimed is:

1. A memory device comprising:

a power supply for supplying power to said ferroelectric memory device;

a memory cell array comprising a plurality of memory cells, each said memory cell comprising a switching transistor and a ferroelectric capacitor, said ferroelectric capacitor being connected to a data line at an electrode thereof through said switching transistor and being connected to a cell electrode line at another electrode thereof, said switching transistor being further connected to a selection line at a control electrode thereof, said switching transistor being forced into conduction when a selection signal appears on said selection line and being forced out of conduction when a non-selection signal appears on said selection line;

voltage generating means for generating a first predetermined voltage on said cell electrode line;

detecting means for detecting an voltage of said power supply to generate a low-voltage detection signal when said voltage of said power supply is lower than a predetermined threshold voltage; and protective control means responsive to said low-voltage detection signal for fixing said selection line at a second predetermined voltage so as to protect said ferroelectric capacitor from a voltage change of said selection line.

2. The memory device according to claim 1, wherein said protective control means comprises:

a selection line controller for outputting one of said selection signal and said non-selection signal to said selection line according to an address signal received from outside; and protective means responsive to said low-voltage detection signal, for outputting said non-selection signal to said selection line regardless of said address signal.

3. The memory device according to claim 2, wherein said protective means comprises:

a second switching transistor having a first main electrode connected to said selection line and a second main electrode connected to a voltage level of said non-selection signal, said low-voltage detection signal being applied to a third electrode for on and off control of said second switching transistor.

4. The memory device according to claim 2, wherein said protective means comprises:

a first gate circuit for performing a logical NAND function on an output of said selection line controller and said low-voltage detection signal; and a second gate circuit for performing a logical inverse function on an output of said first gate circuit, said low-voltage detection signal lowering an output of said second gate circuit to a voltage level of said non-selection signal.

5. The memory device according to claim 1, wherein said protective control means comprises:

an address buffer for storing an address signal received from outside;

a decoder for decoding said address signal to output one of said selection signal and said non-selection signal to said selection line according to said address signal; and a controller responsive to said low-voltage detection signal, for controlling said decoder so as to output said non-selection signal to said selection line regardless of said address signal.

6. The memory device according to claim 5, wherein said decoder comprises:

a first gate circuit for performing a logical NAND function on a decoded signal of said decoder and a control signal received from said controller; and a second gate circuit for performing a logical inverse function on an output of said first gate circuit, said control signal lowering an output of said second gate circuit to a voltage level of said non-selection signal.

7. The memory device according to claim 1, wherein said second predetermined voltage has a grounding voltage level.

8. The memory device according to claim 2, wherein said non-selection signal has a grounding voltage level.

9. The memory device according to claim 3, wherein said non-selection signal has a grounding voltage level.

10. The memory device according to claim 4, wherein said non-selection signal has a grounding voltage level.

11. The memory device according to claim 5, wherein said non-selection signal has a grounding voltage level.

12. The memory device according to claim 6, wherein said non-selection signal has a grounding voltage level.

13. A memory device comprising:

a power supply for supplying power to said ferroelectric memory device;

a memory cell array comprising a plurality of memory cells, each said memory cell comprising a switching transistor and a ferroelectric capacitor, said ferroelectric capacitor being connected to a data line at an electrode thereof through said switching transistor and being connected to a cell electrode line at another electrode thereof, said switching transistor being further connected to a selection line at a control electrode thereof, said switching transistor being forced into conduction when a selection signal appears on said selection line and being forced out of conduction when a non-selection signal appears on said selection line;

voltage generating means for generating a first predetermined voltage on said cell electrode line;

detecting means for detecting a voltage of said power supply to generate a low-voltage detection signal when said voltage of said power supply is lower than a predetermined threshold voltage; and protective control means responsive to said low-voltage detection signal for fixing said data line at a second predetermined voltage so as to protect said ferroelectric capacitor from a voltage change of said selection line.

14. The memory device according to claim 13, wherein said protective control means comprises:

a voltage equalizing means responsive to said low-voltage detection signal, for equalizing a voltage level of said data line to said second predetermined voltage.

15. The memory device according to claim 14, wherein said second predetermined voltage is equal to said first predetermined voltage.

16. A memory device comprising:

a power supply for supplying power to said memory device;

a memory cell array comprising a plurality of memory cells arranged in a first number of rows and a second number of columns, memory cells of each said column being connected in common to a word line, memory cells of each said row being connected alternately to one of a pair of data lines, each said memory cell comprising a switching transistor and a ferroelectric capacitor, said ferroelectric capacitor being connected to said data line at an electrode thereof through said switching transistor and being connected to a plate line at another electrode thereof, said switching transistor being connected to said word line at a control electrode thereof, said switching transistor being forced into conduction when a selection signal appears on said word line and being forced out of conduction when a non-selection signal appears on said word line;

said first number of sense amplifiers each connected to said pair of data lines;

a voltage generating circuit for generating a first predetermined voltage on said plate line;

a voltage detector for detecting a voltage of said power supply to generate a low-voltage detection signal when said voltage of said power supply is lower than a predetermined threshold voltage;

a word-line controller for outputting one of said selection signal and said non-selection signal to said word line according to an address signal received from outside; and a protective circuit responsive to said low-voltage detection signal for outputting said non-selection signal to said word line regardless of said address signal.

17. The memory device according to claim 16, wherein said non-selection signal has a grounding voltage level.

18. A memory device comprising:

a power supply for supplying power to said memory device;

a memory cell array comprising a plurality of memory cells arranged in a first number of rows and a second number of columns, memory cells of each said column being connected in common to a word line, memory cells of each said row being connected alternately to one of a pair of data lines, each said memory cell comprising a switching transistor and a ferroelectric capacitor, said ferroelectric capacitor being connected to said data line at an electrode thereof through said switching transistor and being connected to a plate line at another electrode thereof, said switching transistor being connected to said word line at a control electrode thereof, said switching transistor being forced into conduction when a selection signal appears on said word line and being forced out of conduction when a non-selection signal appears on said word line;

said first number of sense amplifiers each connected to said pair of data lines;

a voltage generating circuit for generating a first predetermined voltage on said plate line;

a voltage detector for detecting a voltage of said power supply to generate a low-voltage detection signal when said voltage of said power supply is lower than a predetermined threshold voltage;

a word-line controller for outputting one of said selection signal and said non-selection signal to said word line according to an address signal received from outside; and a voltage equalizing circuit responsive to said low-voltage detection signal, for equalizing a voltage level of said data line to said first predetermined voltage.

19. A method for protecting data stored in a memory device comprising:

a power supply for supplying power to said memory device; and a memory cell array comprising a plurality of memory cells, each said memory cell comprising a switching transistor and a ferroelectric capacitor, said ferroelectric capacitor being connected to a data line at an electrode thereof through said switching transistor and being connected to a cell electrode line at another electrode thereof, said switching transistor being further connected to a selection line at a control electrode thereof, said switching transistor being forced into conduction when a selection signal appears on said selection line and being forced out of conduction when a non-selection signal appears on said selection line, said method comprising the steps of:

generating a first predetermined voltage on said cell electrode line;

detecting a voltage of said power supply to generate a low-voltage detection signal when said voltage of said power supply is lower than a predetermined threshold voltage;

outputting one of said selection signal and said non-selection signal to said selection line according to an address signal received from outside; and outputting said non-selection signal to said selection line in response to said low-voltage detection signal regardless of said address signal.

20. A method for protecting data stored in a memory device comprising:

a power supply for supplying power to said memory device; and a memory cell array comprising a plurality of memory cells, each said memory cell comprising a switching transistor and a ferroelectric capacitor, said ferroelectric capacitor being connected to a data line at an electrode thereof through said switching transistor and being connected to a cell electrode line at another electrode thereof, said switching transistor being further connected to a selection line at a control electrode thereof, said switching transistor being forced into conduction when a selection signal appears on said selection line and being forced out of conduction when a non-selection signal appears on said selection line, said method comprising the steps of:

generating a first predetermined voltage on said cell electrode line;

detecting a voltage of said power supply to generate a low-voltage detection signal when said voltage of said power supply is lower than a predetermined threshold voltage;

outputting one of said selection signal and said non-selection signal to said selection line according to an address signal received from outside; and equalizing a voltage level of said data line to said first predetermined voltage.

* * * * *